(12) United States Patent
Moon et al.

(10) Patent No.: US 11,600,684 B2
(45) Date of Patent: Mar. 7, 2023

(54) DISPLAY APPARATUS HAVING AN OXIDE SEMICONDUCTOR PATTERN

(71) Applicant: LG Display Co., Ltd., Seoul (KR)

(72) Inventors: Kyeong-Ju Moon, Gimpo-si (KR); So-Young Noh, Seoul (KR); Ki-Tae Kim, Goyang-si (KR); Hyuk Ji, Seoul (KR)

(73) Assignee: LG DISPLAY CO., LTD., Seoul (KR)

(*) Notice: Subject to any disclaimer, the term of this patent is extended or adjusted under 35 U.S.C. 154(b) by 248 days.

(21) Appl. No.: 17/135,564

(22) Filed: Dec. 28, 2020

(65) Prior Publication Data

US 2021/0202671 A1 Jul. 1, 2021

(30) Foreign Application Priority Data

Dec. 31, 2019 (KR) .......................... 10-2019-0180187

(51) Int. Cl.
*H01L 27/32* (2006.01)
*H01L 51/52* (2006.01)

(52) U.S. Cl.
CPC ...... *H01L 27/3276* (2013.01); *H01L 51/5253* (2013.01)

(58) Field of Classification Search
CPC ............. H01L 27/3276; H01L 51/5253; H01L 27/3244; H01L 27/3262; H01L 29/7869
See application file for complete search history.

(56) References Cited

U.S. PATENT DOCUMENTS

2018/0151144 A1* 5/2018 Kawashima ........ G06F 3/04184

* cited by examiner

*Primary Examiner* — Kyoung Lee
(74) *Attorney, Agent, or Firm* — Birch, Stewart, Kolasch & Birch, LLP

(57) ABSTRACT

A display apparatus in which a thin film transistor of each pixel region includes an oxide semiconductor pattern is provided. The pixel regions can be disposed on a display area of a device substrate. The display area can be electrically connected to the gate driver by gate lines. An encapsulating element can be disposed on the thin film transistor of each pixel region. The encapsulating element can extend beyond the display area. The gate lines can overlap the encapsulating element. A barrier line can be disposed between the gate lines and the encapsulating element. The barrier line can include a hydrogen barrier material. Thus, in the display apparatus, the characteristics deterioration of the thin film transistor due to the encapsulating element can be prevented or minimized.

20 Claims, 8 Drawing Sheets

DISPLAY APPARATUS HAVING AN OXIDE SEMICONDUCTOR PATTERN

CROSS-REFERENCE TO RELATED APPLICATIONS

This application claims the priority benefit of Korean Patent Application No. 10-2019-0180187, filed on Dec. 31, 2019 in the Republic of Korea, the entire contents of which are hereby expressly incorporated by reference as if fully set forth herein into the present application.

BACKGROUND OF THE INVENTION

Field of the Invention

The present disclosure relates to a display apparatus in which a thin-film transistor of each pixel region includes an oxide semiconductor pattern.

Discussion of the Related Art

In general, an electronic appliance such as a monitor, a TV, a laptop computer, and a digital camera includes a display apparatus to realize an image. For example, the display apparatus can include a light-emitting device. The light-emitting device can emit light displaying a specific color. For example, the light-emitting device can include a light-emitting layer disposed between a first electrode and a second electrode.

The display apparatus can include a driving circuit electrically connected to the light-emitting device, and an encapsulating element covering the driving circuit and the light-emitting device. The driving circuit can provide a driving current corresponding to a data signal to the light-emitting device according to a gate signal. For example, the driving circuit can include at least one thin-film transistor.

The thin-film transistor can include an oxide semiconductor to prevent defects due to leakage current. The encapsulating element can prevent damage of the light-emitting device due to an external impact and moisture. For example, the encapsulating element can have a structure in which an inorganic insulating layer and an organic insulating layer are stacked.

The gate signal can be transmitted through a gate line. A gate driver generating the gate signal can be disposed outside a display area in which the driving circuit and the light-emitting device are disposed. However, in the display apparatus, hydrogen diffused from the encapsulating element can move through the gate line and thus hydrogen can inflow to the driving circuit through the gate line. Therefore, in the display apparatus, the oxide semiconductor pattern can be deteriorated by hydrogen, and the characteristics of the thin-film transistor can be affected.

SUMMARY OF THE INVENTION

Accordingly, the present invention is directed to a display apparatus that substantially obviates one or more problems due to limitations and disadvantages of the related art.

An object of the present disclosure is to provide a display apparatus capable of preventing the inflow of hydrogen through gate lines.

Another object of the present disclosure is to provide a display apparatus capable of preventing the gate line and/or the data line connected to a driving circuit of each pixel region from serving as a path of inflowing hydrogen.

Additional advantages, objects, and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

To achieve these objects and other advantages and in accordance with the purpose of the invention, as embodied and broadly described herein, there is provided a display apparatus comprising pixel regions. Each of the pixel regions includes a driving circuit and a light-emitting device. The driving circuit includes an oxide semiconductor pattern. The light-emitting device is connected to the driving circuit. A gate driver is disposed outside the pixel regions. The gate driver is connected to the pixel regions by gate lines. An encapsulating element is disposed on the pixel regions. The encapsulating element overlaps the gate lines. A first barrier line is disposed between the gate lines and the encapsulating element. The first barrier line intersects the gate lines. The first barrier line includes a hydrogen barrier material.

The hydrogen barrier material can include titanium (Ti).

A pad region can be disposed outside the pixel regions. The pad region can be connected to the pixel regions by data lines. The data lines can include the same material as the first barrier line.

The first barrier line can be spaced away from the data lines.

A second barrier line can be disposed between the first barrier line and the gate driver. The second barrier line can extend side by side with the first barrier line.

The first barrier line can be connected to the pad region.

The driving circuit can include a gate electrode overlapping with a channel region of the oxide semiconductor pattern, a gate insulating layer disposed between the oxide semiconductor pattern and the gate electrode, a source electrode connected to a source region of the oxide semiconductor pattern, and a drain electrode connected to a drain region of the oxide semiconductor pattern. The source electrode and the drain electrode can be disposed on the same layer as the first barrier line.

In another embodiment, a display apparatus includes a device substrate. The device substrate includes a display area and a non-display area. The non-display area is disposed outside the display area. A gate driver is disposed on the non-display area of the device substrate. The gate driver is connected to the display area by gate lines. A barrier line intersects the gate lines. The barrier line includes a hydrogen barrier material. An encapsulating element is disposed on the display area of the device substrate. The encapsulating element extends on the gate lines. The gate lines are disposed between the device substrate and the barrier line.

Driving circuits can be disposed on the display area of the device substrate. Each of the driving circuits can include a thin film transistor. The thin film transistor can be connected to one of the gate lines. The thin film transistor can include an oxide semiconductor pattern.

A pad region can be disposed in the non-display are of the device substrate. The pad region can be connected to the display area by data lines. Each of the date lines can include a portion disposed between the device substrate and the barrier line.

A stacked structure of the data lines can be different from a stacked structure of the barrier line.

The barrier line can have a closed loop shape extending along an edge of the display area.

The barrier line can include a first region and a second region. The first region can have a first width. The second region can have a second width larger than the first width. A corner of the display area can have a round shape. The second region of the barrier line can correspond to the corner of the display area.

A distance between the barrier line and the display area can be constant.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Figure 1:
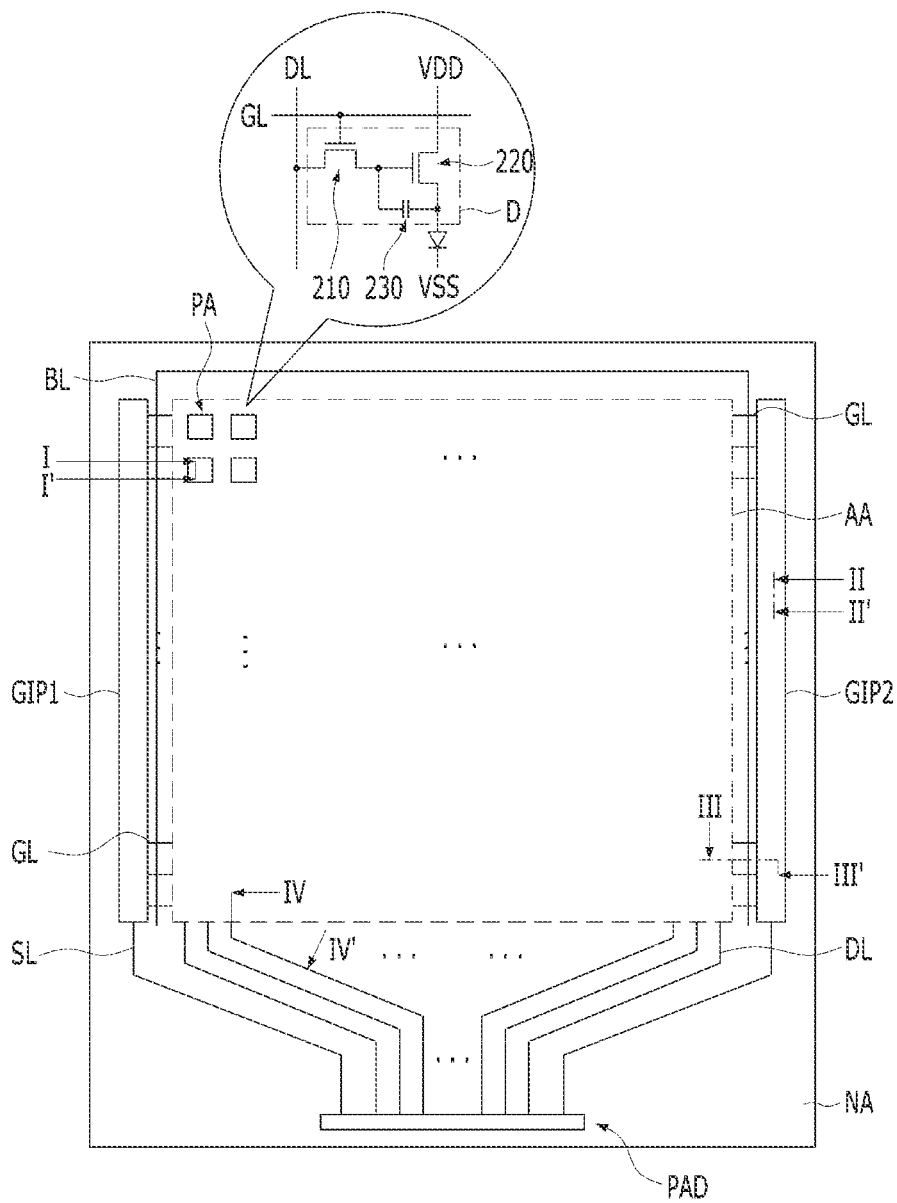
FIG. 1 is a view schematically showing a display apparatus according to an embodiment of the present invention.

Hereinafter, details related to the above objects, technical configurations, and operational effects of the embodiments of the present invention will be clearly understood by the following detailed description with reference to the drawings, which illustrate some embodiments of the present invention. Here, the embodiments of the present invention are provided in order to allow the technical sprit of the present invention to be satisfactorily transferred to those skilled in the art, and thus the present invention can be embodied in other forms and is not limited to the embodiments described below.

In addition, the same or extremely similar elements can be designated by the same reference numerals throughout the specification, and in the drawings, the lengths and thickness of layers and regions can be exaggerated for convenience. It will be understood that, when a first element is referred to as being "on" a second element, although the first element can be disposed on the second element so as to come into contact with the second element, a third element can be interposed between the first element and the second element.

Here, terms such as, for example, "first" and "second" can be used to distinguish any one element with another element and may not define order. However, the first element and the second element can be arbitrary named according to the convenience of those skilled in the art without departing the technical sprit of the present invention.

The terms used in the specification of the present invention are merely used in order to describe particular embodiments, and are not intended to limit the scope of the present invention. For example, an element described in the singular form is intended to include a plurality of elements unless the context clearly indicates otherwise. In addition, in the specification of the present invention, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiments

Figure 2A:
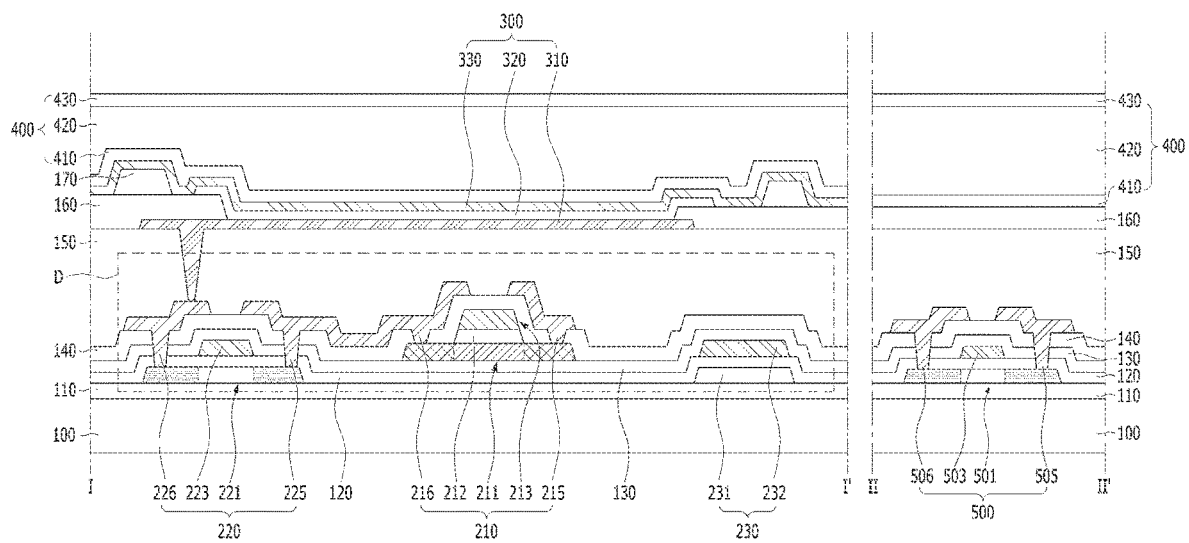
FIG. 2A is a view showing cross-sections taken along line I-I' and line II-II' of FIG. 1.
Figure 2B:
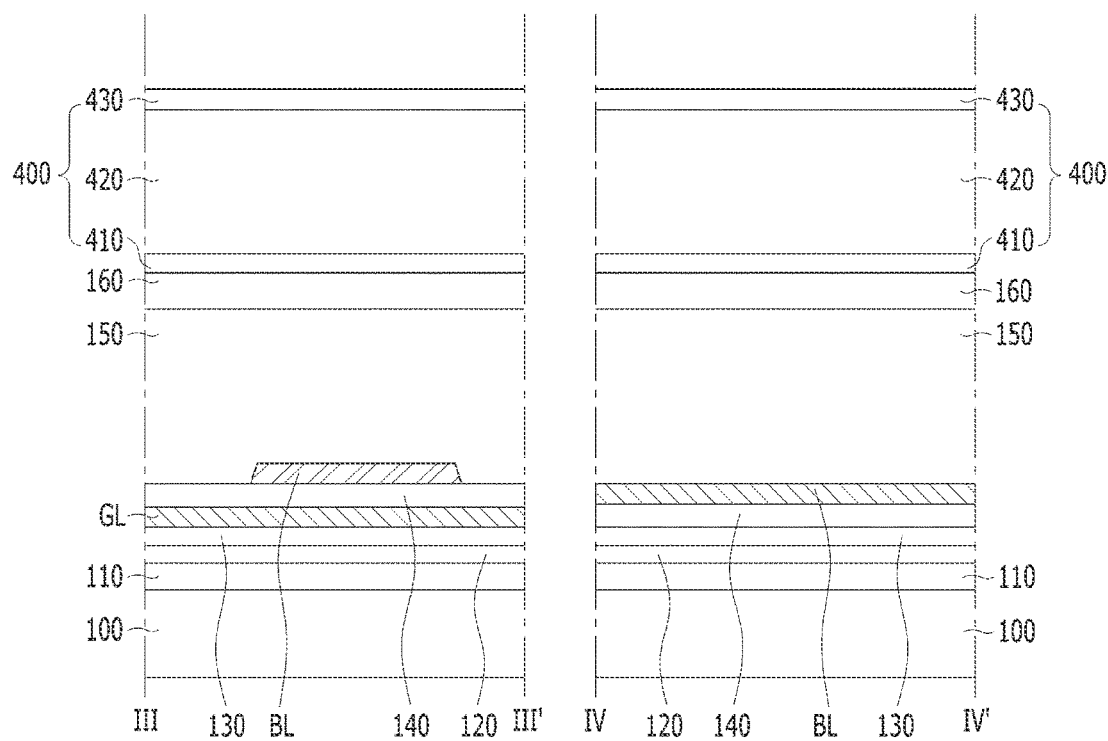
FIG. 2B is a view showing cross-sections taken along line III-III' and line IV-IV' of FIG. 1.

FIG. 1 is a view schematically showing a display apparatus according to an embodiment of the present invention. FIG. 2A is a view showing cross-sections taken along line I-I' and line II-II' of FIG. 1. FIG. 2B is a view showing cross-sections taken along line III-III' and line IV-IV' of FIG. 1. All components of the display apparatus according to all embodiments of the present invention are operatively coupled and configured.

Referring to FIGS. 1, 2A and 2B, the display apparatus according to the embodiment of the present invention can include a device substrate 100. The device substrate 100 can include an insulating material. For example, the device substrate 100 can include glass or plastic.

The device substrate 100 can include a display area AA and a non-display area NA. The display area AA can realize an image provided to a user. For example, pixel regions PA can be disposed in the display area AA. Each of the pixel regions PA can realize a specific color. For example, each of the pixel regions PA can include a driving circuit D and a light-emitting device 300.

The driving circuit D can generate a driving current corresponding to a data signal according to a gate signal. For example, the driving circuit D can include a first thin film transistor 210, a second thin film transistor 220 and a storage capacitor 230.

The first thin film transistor 210 can turn on/off the second thin film transistor 220 according to the gate signal. For example, the first thin film transistor 210 can include a first semiconductor pattern 211, a first gate insulating layer 212, a first gate electrode 213, a first source electrode 215 and a first drain electrode 216.

The first semiconductor pattern 211 can be an oxide semiconductor. For example, the first semiconductor pattern 211 can be an oxide semiconductor pattern including a metal oxide, such as IGZO. Thus, in the display apparatus according to the embodiment of the present invention, the defects of the first thin film transistor 210 due to a leakage current can be prevented.

The first semiconductor pattern 211 can include a first source region, a first channel region and a first drain region. The first channel region can be disposed between the first source region and the first drain region. The first source region and the first drain region can have higher electrical conductivity than the first channel region. A resistance of the first source region and a resistance of the first drain region can be lower than a resistance of the first channel region. For example, the first source region and the first drain region can be a conductorized region.

The first gate insulating layer 212 can be disposed on the first semiconductor pattern 211. For example, the first gate insulating layer 212 can overlap the first channel region of the first semiconductor pattern 211. The first source region and the first drain region of the first semiconductor pattern 211 can be disposed outside the first gate insulating layer 212. The first gate insulating layer 212 can include an insulating material. For example, the first gate insulating layer 212 can include silicon oxide (SiOx). The first gate insulating layer 212 can include a material having a high dielectric constant. For example, the first gate insulating layer 212 can include a High-K material, such as hafnium oxide (HfO). The first gate insulating layer 212 can have a multi-layer structure.

The first gate electrode 213 can be disposed on the first gate insulating layer 212. For example, the first gate electrode 213 can overlap the first channel region of the first semiconductor pattern 211. A side surface of the first gate insulating layer 212 can be vertically aligned with a side surface of the first gate electrode 213. For example, the first gate electrode 213 can be insulated from the first semiconductor pattern 211 by the first gate insulating layer 212. The first channel region of the first semiconductor pattern 211 can have an electrical conductivity corresponding to a voltage applied to the first gate electrode 213. For example, the first channel region of the first semiconductor pattern 211 can be a semiconductor region. The first gate electrode 213 can include a conductive material. For example, the first gate electrode 213 can include a metal, such as aluminum (Al), titanium (Ti), chromium (Cr), molybdenum (Mo), tungsten (W) and copper (Cu), or alloys thereof. The first gate electrode 213 can be formed of a single layer or multiple layers.

The first source electrode 215 can be electrically connected to the first source region of the first semiconductor pattern 211. For example, the first source electrode 215 can be in direct contact with a portion of the first source region. The first source electrode 215 can include a portion overlapping with the first source region. The first source electrode 215 can be insulated from the first gate electrode 213. For example, an upper interlayer insulating layer 140 can be disposed on the first semiconductor pattern 211 and the first gate electrode 213, and the first source electrode 215 can be disposed on the upper interlayer insulating layer 140. The upper interlayer insulating layer 140 can include an insulating material. For example, the upper interlayer insulating layer 140 can include silicon oxide (SiOx) or silicon nitride (SiNx). The upper interlayer insulating layer 140 can extend beyond the first semiconductor pattern 211. For example, a side surface of the first semiconductor pattern 211 and a side surface of the first gate electrode 213 can be in direct contact with the upper interlayer insulating layer 140. The upper interlayer insulating layer 140 can include a first source contact hole partially exposing the first source region of the first semiconductor pattern 211. The first source electrode 215 can be connected to the first source region of the first semiconductor pattern 211 in the first source contact hole.

Referring to FIG. 2A, the upper interlayer insulating layer 140 is illustrated as a single layer, but is not limited thereto. For example, the upper interlayer insulating layer 140 can have a stacked structure of a layer formed of silicon nitride (SiNx) and a layer formed of silicon oxide (SiOx). The upper interlayer insulating layer 140 can be a double-layer structure of a layer formed of silicon nitride (SiNx) and a layer formed of silicon oxide (SiOx).

The first source electrode 215 can include a conductive material. For example, the first source electrode 215 can include a metal, such as aluminum (Al), chromium (Cr), titanium (Ti), molybdenum (Mo), tungsten (W) and copper (Cu), or alloys thereof. The first source electrode 215 can have a single layer or multiple layers. The first source electrode 215 can include a material different from the first gate electrode 213.

The first drain electrode 216 can be electrically connected to the first drain region of the first semiconductor pattern 211. For example, the first drain electrode 216 can be in direct contact with a portion of the first drain region. The first drain electrode 216 can include a portion overlapping with the first drain region. The first drain electrode 216 can be insulated from the first gate electrode 213. For example, the first drain electrode 216 can be disposed on the upper interlayer insulating layer 140. The first drain electrode 216 can be spaced away from the first source electrode 215. For example, the upper interlayer insulating layer 140 can include a first drain contact hole partially exposing the first drain region. The first drain electrode 216 can be connected to the first drain region in the first drain contact hole.

The first drain electrode 216 can include a conductive material. For example, the first drain electrode 216 can include a metal, such as aluminum (Al), titanium (Ti), chromium (Cr), molybdenum (Mo), tungsten (W) and copper (Cu), or alloys thereof. The first drain electrode 216 can have a single layer or multiple layers. The first drain electrode 216 can include the same material as the first source electrode 215. The first drain electrode 216 can include a material different from the first gate electrode 213.

The second thin film transistor 220 can generate a driving current corresponding to the data signal. The second thin film transistor 220 can have the same configuration as the first thin film transistor 210. For example, the second thin film transistor 220 can include a second semiconductor pattern 221, a second gate electrode 223, a second source electrode 225 and a second drain electrode 226.

The second semiconductor pattern 221 can include a material different from the first semiconductor pattern 211. For example, the second semiconductor pattern 221 can include silicon. The second semiconductor pattern 221 can be disposed on a layer different from the first semiconductor pattern 211. For example, a lower interlayer insulating layer 130 can be disposed between the device substrate 100 and the first semiconductor pattern 211, and the second semiconductor pattern 221 can be disposed between the device substrate 100 and the lower interlayer insulating layer 130. Thus, in the display apparatus according to the embodiment of the present invention, the first semiconductor pattern 211 may not be affected by a process of forming the second semiconductor pattern 221.

Referring to FIG. 2A, the lower interlayer insulating layer 130 is illustrated as a single layer, but is not limited thereto. For example, the lower interlayer insulating layer 130 can have a stacked structure in which a layer formed of silicon nitride (SiNx) and a layer formed of silicon oxide (SiOx). The lower interlayer insulating layer 130 can be a triple-layer structure of a first layer formed of silicon nitride (SiNx), a second layer formed of silicon nitride (SiNx), and a third layer formed of silicon oxide (SiOx).

The second semiconductor pattern 221 can have the same configuration as the first semiconductor pattern 211. For example, the second semiconductor pattern 221 can include a second channel region disposed between a second source region and a second drain region. The second source region and the second drain region can have a lower resistance than the second channel region. For example, the second source region and the second drain region have a larger concentration of conductive impurities than the second channel region.

The second gate electrode 223 can be disposed on the second channel region of the second semiconductor pattern 221. For example, the second semiconductor pattern 221 can be disposed between the device substrate 100 and the second gate electrode 223. The second gate electrode 223 can be disposed on a layer different from the first gate electrode 213. For example, the second gate electrode 223 can be disposed between the second semiconductor pattern 221 and the lower interlayer insulating layer 130. The second gate electrode 223 can include a conductive material. For example, the second gate electrode 223 can include a metal, such as aluminum (Al), titanium (Ti), chromium (Cr), molybdenum (Mo), tungsten (W) and copper (Cu), or alloys thereof. The second gate electrode 223 can be formed of a single layer or multiple layers. The second gate electrode 223 can include the same material as the first gate electrode 213.

The second gate electrode 223 can be insulated from the second semiconductor pattern 221. For example, a second gate insulating layer 120 can be disposed between the second semiconductor pattern 221 and the second gate electrode 223. The second gate insulating layer 120 can include an insulating material. For example, the second gate insulating layer 120 can include silicon oxide (SiOx). The second gate insulating layer 120 can include a material having a high dielectric constant. For example, the second gate insulating layer 120 can include a High-K material, such as hafnium oxide (HfO). The second gate insulating layer 120 can have a multi-layer structure. For example, a stacked structure of the second gate insulating layer 120 can be the same as a stacked structure of the first gate insulating layer 212.

The second gate insulating layer 120 can extend beyond the second semiconductor pattern 221. For example, a side surface of the second semiconductor pattern 221 can be covered by the second gate insulating layer 120. The second gate insulating layer 120 can extend between the device substrate 100 and the lower interlayer insulating layer 130. For example, the second gate insulating layer 120 can include a portion overlapping with the first semiconductor pattern 211.

The second source electrode 225 can include a conductive material. For example, the second source electrode 225 can include a metal, such as aluminum (Al), chromium (Cr), titanium (Ti), molybdenum (Mo), tungsten (W) and copper (Cu), or alloys thereof. The second source electrode 225 can have a single layer or multiple layers. The second source electrode 225 can include a material different from the second gate electrode 223. The second source electrode 225 can be connected to the first drain electrode 216. Alternatively, as shown in FIG. 1, the second source electrode 225 can be connected to a line applying a positive power voltage VDD. The second source electrode 225 can be disposed on the same layer as the first drain electrode 216. For example, the second source electrode 225 can be disposed on the upper interlayer insulating layer 140. The second source electrode 225 can include the same material as the first drain electrode 216. For example, the second source electrode 225 can be in direct contact with the first drain electrode 216. The second source electrode 225 can be electrically connected to the second source region of the second semiconductor pattern 221. For example, the second source electrode 225 can be in direct contact with a portion of the second source region. The second source electrode 225 can include a portion overlapping with the second source region. The second gate insulating layer 120, the lower interlayer insulating layer 130 and the upper interlayer insulating layer 140 can include a second source contact hole partially exposing the second source region of the second semiconductor pattern 221. The second source electrode 225 can be connected to the second source region of the second semiconductor pattern 221 in the second source contact hole.

The second drain electrode 226 can include a conductive material. For example, the second drain electrode 226 can include a metal, such as aluminum (Al), chromium (Cr), titanium (Ti), molybdenum (Mo), tungsten (W) and copper (Cu), or alloys thereof. The second drain electrode 226 can have a single layer or multiple layers. The second drain electrode 226 can include a material different from the second gate electrode 223. The second drain electrode 226 can include the same material as the second source electrode 225. The second drain electrode 226 can be disposed on the same layer as the second source electrode 225. For example, the second drain electrode 226 can be disposed on the upper interlayer insulating layer 140.

The second drain electrode 226 can be electrically connected to the second drain region of the second semiconductor pattern 221. For example, the second drain electrode 226 can be in direct contact with a portion of the second drain region. The second drain electrode 226 can include a portion overlapping with the second drain region. The second drain electrode 226 can be spaced away from the second source electrode 225. The second gate insulating layer 120, the lower interlayer insulating layer 130 and the upper interlayer insulating layer 140 can include a second drain contact hole partially exposing the second drain region of the second semiconductor pattern 221. The second drain electrode 226 can be connected to the second drain region of the second semiconductor pattern 221 in the second drain contact hole.

The storage capacitor 230 can maintain the operation of the second thin film transistor 220 for one frame. For example, the storage capacitor 230 can include a first capacitor electrode 231 connected to the second gate electrode 223 of the second thin film transistor 220, and a second capacitor electrode 232 connected to the second drain electrode 226 of the second thin film transistor 220. The first capacitor electrode 231 and the second capacitor electrode 232 can be formed by a process of forming the second thin film transistor 220. For example, the first capacitor electrode 231 can include the same material as the second semiconductor pattern 221, and the second capacitor electrode 232 can include the same material as the second gate electrode 223. The second gate insulating layer 120 can be disposed between the first capacitor electrode 231 and the second capacitor electrode 232. The second capacitor electrode 232 can include a portion overlapping with the first capacitor electrode 231.

A buffer layer 110 can be disposed between the device substrate 100 and the driving circuit D. The buffer layer 110 can prevent pollution from the device substrate 100 during the process of forming the driving circuit D. The buffer layer 110 can include an insulating material. For example, the buffer layer 110 can include silicon oxide (SiOx) and/or silicon nitride (SiNx). The buffer layer 110 can have a multi-layer structure. For example, the buffer layer 110 can have a structure in which an insulating layer formed of silicon oxide (SiOx) and an insulating layer formed of silicon nitride (SiNx) are stacked.

An over-coat layer 150 can be disposed on the driving circuit D. The over-coat layer 150 can remove a thickness difference due to the driving circuit D. For example, a surface of the over-coat layer 150 opposite to the device substrate 100 can be a flat surface. A thickness difference due to the first thin film transistor 210, the second thin film transistor 220 and the storage capacitor 230 can be removed by the over-coat layer 150. The over-coat layer 150 can include an insulating material. The over-coat layer 150 can include a material having relatively high fluidity. For example, the over-coat layer 150 can include an organic material.

The light-emitting device 300 can be disposed on the over-coat layer 150. The light-emitting device 300 can emit light displaying a specific color. For example, the light-emitting device 300 can include a first electrode 310, a light-emitting layer 320 and a second electrode 330, which are sequentially stacked on the over-coat layer 150. The light-emitting device 300 can be electrically connected to the driving circuit D. For example, the first electrode 310 can be connected to the second drain electrode 226 of the second thin film transistor 220. The first electrode 310 can include a portion overlapping with the second drain electrode 226. For example, the over-coat layer 150 can include an electrode contact hole partially exposing the second drain electrode 226. The first electrode 310 can be in direct contact with the second drain electrode 226 in the electrode contact hole. Thus, in the display apparatus according to the embodiment of the present invention, the light-emitting device 300 of each pixel region PA can emit light having a luminance corresponding to the driving current which is generated by the driving circuit D of the corresponding pixel region PA.

The first electrode 310 can include a conductive material. The first electrode 310 can include a material having relatively high reflectance. For example, the first electrode 310 can include a metal, such as aluminum (Al) and silver (Ag). The first electrode 310 can have a multi-layer structure. For example, the first electrode 310 can have a structure in which a reflective electrode formed of a metal is disposed between transparent electrodes formed of a transparent conductive material, such as ITO and IZO.

The light-emitting layer 320 can generate light having luminance corresponding to a voltage difference between the first electrode 310 and the second electrode 330. For example, the light-emitting layer 320 can be an emission material layer (EML) including an emission material. The emission material can include an organic material, an inorganic material or a hybrid material. For example, the display apparatus according to the embodiment of the present invention can be an organic light-emitting display apparatus including a light-emitting layer 320 formed of an organic material.

The second electrode 330 can include a conductive material. The second electrode 330 can include a material different from the first electrode 310. For example, the second electrode 330 can be a transparent electrode formed of a transparent conductive material, such as ITO and IZO. Thus, in the display apparatus according to the embodiment of the present invention, the light generated by the light-emitting layer 320 can be emitted outside through the second electrode 330.

The light-emitting device 300 can further include an emitting function layer between the first electrode 310 and the light-emitting layer 320, and/or between the light-emitting layer 320 and the second electrode 330. The emitting function layer can include at least one of a hole injection layer (HIL), a hole transporting layer (HTL), an electron transporting layer (ETL), and an electron injection layer (EIL). Thus, in the display apparatus according to the embodiment of the present invention, the emission efficiency of the light-emitting device 300 can be improved.

An encapsulating element 400 can be disposed on the light-emitting device 300. The encapsulating element 400 can prevent damage of the light-emitting device 300 due to the external moisture and impact. For example, the encapsulating element 400 can completely cover the second electrode 330 of the light-emitting device 300. The encapsulating element 400 can extend beyond the second electrode 330.

The encapsulating element 400 can have a multi-layer structure. For example, the encapsulating element 400 can include a first encapsulating layer 410, a second encapsulating layer 420 and a third encapsulating layer 430, which are sequentially stacked on the second electrode 330. The first encapsulating layer 410, the second encapsulating layer 420 and the third encapsulating layer 430 can include an insulating material. The second encapsulating layer 420 can include a material different from the first encapsulating layer 410 and the third encapsulating layer 430. For example, the first encapsulating layer 410 and the third encapsulating layer 430 can include an inorganic material, and the second encapsulating layer 420 can include an organic material. Thus, in the display apparatus according to the embodiment of the present invention, the damage of the light-emitting device 300 due to the external moisture and impact can be effectively prevented. A thickness difference due to the light-emitting device 300 can be removed by the second encapsulating layer 420. For example, a surface of the encapsulating element 400 opposite to the device substrate 100 can be parallel with a surface of the device substrate 100.

The light-emitting device 300 of each pixel region PA can be controlled independently from the light-emitting device 300 of adjacent pixel region PA. For example, the first electrode 310 of each light-emitting device 300 can be insulated from the first electrode 310 of adjacent light-emitting device 300. For example, the first electrode 310 of each light-emitting device 300 can be spaced away from the first electrode 310 of adjacent light-emitting device 300. A bank insulating layer 160 can be disposed in a space between adjacent first electrodes 310. The bank insulating layer 160 can include an insulating material. For example, the bank insulating layer 160 can include an organic insulating material. The bank insulating layer 160 can be in contact with the over-coat layer 150 between adjacent first electrodes 310. The bank insulating layer 160 can include a material different from the over-coat layer 150. The bank insulating layer 160 can cover an edge of each first electrode 310. For example, the light-emitting layer 320 and the second electrode 330 of each light-emitting device 300 can be stacked on a portion of the corresponding first electrode 310 exposed by the bank insulating layer 160.

The light-emitting device 300 of each pixel region PA can realize a color different from the light-emitting device 300 of adjacent pixel region PA. For example, the light-emitting layer 320 of each light-emitting device 300 can include a material different from the light-emitting layer 320 of adjacent light-emitting device 300. The light-emitting layer 320 of each light-emitting device 300 can be spaced away from the light-emitting layer 320 of adjacent light-emitting device 300. For example, the light-emitting layer 320 of each light-emitting device 300 can include an end on the bank insulating layer 160.

The light-emitting layer 320 of each light-emitting device 300 can be formed by a deposition process using a fine metal mask (FMM). For example, a spacer 170 can be disposed on the bank insulating layer 160. The spacer 170 can prevent the damage of adjacent light-emitting layer 320 and/or the bank insulating layer 160 due to the fine metal mask. Each of the light-emitting layers 320 can be spaced away from the spacer 170. For example, the end of each light-emitting layer 320 can be disposed on a surface of the bank insulating layer 160 which is disposed outside the spacer 170. The spacer 170 can include an insulating material.

A voltage applied to the second electrode 330 of each light-emitting device 300 can be the same as a voltage applied to the second electrode 330 of adjacent light-emitting device 300. For example, the second electrode 330 of each light-emitting device 300 can be electrically connected to the second electrode 330 of adjacent light-emitting device 300. The second electrode 330 of each light-emitting device 300 can include the same material as the second electrode 330 of adjacent light-emitting device 300. The second electrode 330 of each light-emitting device 300 can be in contact with the second electrode 330 of adjacent light-emitting device 300. For example, the second electrode 330 of each light-emitting device 300 can extend onto the bank insulating layer 160 and the spacer 170, such that the bank insulating layer 160 and the spacer 170 can be covered by the second electrode 330.

A stacked structure of each light-emitting device 300 can have the same as a stacked structure of adjacent light-emitting device 300. For example, each of the light-emitting devices 300 can include the emitting function layer same as adjacent light-emitting device 300. The emitting function layer of each light-emitting device 300 can be connected to the emitting function layer of adjacent light-emitting device 300. For example, in the display apparatus according to the embodiment of the present invention, at least one of the hole injection layer (HIL), the hole transporting layer (HTL), the electron transporting layer (ETL), and the electron injection layer (EIL) can extend onto the bank insulating layer 160 and the spacer 170 along the second electrode 330.

A gate driver GIP1 and GIP2 can be disposed on the non-display area NA of the device substrate 100. Each of the pixel regions PA can receive the gate signal from the gate driver GIP1 and GIP2. For example, the gate driver GIP1 and GIP2 can be connected to the display area AA by gate lines GL. The driving circuit D of each pixel region PA can be connected to one of the gate lines GL. For example, the first gate electrode 213 of the first thin film transistor 210 of each driving circuit D can be connected to the corresponding gate line GL. Accordingly, the first semiconductor pattern 211 containing the oxide semiconductor of the first thin film transistor 210 can be deteriorated by the hydrogen moving through the gate line GL.

The gate driver GIP1 and GIP2 can include at least one driver thin film transistor 500. The driver thin film transistor 500 can have the same configuration as the second thin film transistor 220. For example, the driver thin film transistor 500 can include a third semiconductor pattern 501, a third gate electrode 503, a third source electrode 505 and a third drain electrode 506. A stacked structure of the driver thin film transistor 500 can be the same as a stacked structure of the second thin film transistor 220. For example, the third semiconductor pattern 501 can be disposed on the buffer layer 110. The third semiconductor pattern 501 can include the same material as the second semiconductor pattern 221. For example, the third semiconductor pattern 501 can include silicon.

The second gate insulating layer 120 can be disposed between the third semiconductor pattern 501 and the third gate electrode 503. The lower interlayer insulating layer 130 and the upper interlayer insulating layer 140 can be sequentially stacked on the third gate electrode 503. The third source electrode 505 and the third drain electrode 506 can be disposed on the upper interlayer insulating layer 140. The third gate electrode 503, the third source electrode 505 and the third drain electrode 506 can include the same material as the second gate electrode 223, the second source electrode 225 and the second drain electrode 226, respectively.

The over-coat layer 150 can extend on the gate driver GIP1 and GIP2. For example, a thickness difference due to the driver thin film transistor 500 can be removed by the over-coat layer 150. The second electrode 330 of each light-emitting device 300 can be disposed in the display area AA. For example, the over-coat layer 150, the bank insulating layer 160 and the encapsulating element 400 can be sequentially stacked on the driver thin film transistor 500. The bank insulating layer 160 can be in direct contact with the over-coat layer 150 and the encapsulating element 400 on the non-display area NA of the device substrate 100.

The gate lines GL can be disposed on the same layer as the first gate electrode 213 of each driving circuit D. For example, the gate lines GL can be disposed between the lower interlayer insulating layer 130 and the upper interlayer insulating layer 140. The gate lines GL can include a conductive material. For example, the gate lines GL can include a metal, such as aluminum (Al), chromium (Cr), titanium (Ti), molybdenum (Mo), tungsten (W) and copper (Cu), or alloys thereof. The gate lines GL can include the same material as the first gate electrode 213. In the display area AA, as shown in FIG. 2A, an electrode layer, such as a second electrode 330 and the like, is disposed between the gate line GL and the encapsulating element 400, such that the hydrogen diffused from the encapsulating element 400 can be blocked by the electrode layer without moving to the gate line GL in the display area AA. As shown in FIG. 2B, the electrode layer, such as a second electrode 330 and the like, is not disposed in the non-display area AA, such that the gate line GL can be exposed to the encapsulating element 400. In such a case, the hydrogen diffused from the encapsulating element 400 can easily move to the gate line GL in the non-display area AA, and thus, the oxide semiconductor pattern in the display area AA can be deteriorated by the hydrogen moving through the gate line GL.

For this reason, a barrier line BL can be disposed between the display area AA and the gate driver GIP1 and GIP2. The barrier line BL can intersect the gate lines GL. For example, the barrier line BL can extend along an edge of the display area AA. The barrier line BL can be disposed between the gate lines GL and the encapsulating element 400. For example, each of the gate lines GL can include a portion overlapping with the barrier line BL. The barrier line BL can be disposed close to the gate lines GL. For example, the barrier line BL can be disposed between the upper interlayer insulating layer 140 and the over-coat layer 150.

The barrier line BL can include a hydrogen barrier material. The hydrogen barrier material means a material capable of absorbing and/or blocking hydrogen. For example, the hydrogen barrier material can include a metal, such as titanium (Ti). Thus, in the display apparatus according to the embodiment of the present invention, hydrogen diffused from the encapsulating element 400 toward the gate lines GL can be absorbed and/or blocked by the barrier line BL. And, in the display apparatus according to the embodiment of the present invention, hydrogen moving through the gate lines GL can be captured by the barrier line BL. For example, in the display apparatus according to the embodiment of the present invention, hydrogen may not move through the gate lines GL. Therefore, in the display apparatus according to the embodiment of the present invention, the reliability deterioration of the driving circuit D due to hydrogen can be prevented.

A pad region PAD can be disposed in the non-display area NA of the device substrate 100. The pad area PAD can receive various signals from the outside, and apply the signals to the display area AA. For example, the pad region PAD can be connected to the display area AA by data lines DL applying the data signal. The driving circuit D of each pixel region PA can be connected to one of the data lines DL. For example, the first source electrode 215 of each driving circuit D can be electrically connected to the corresponding data line DL.

The data lines DL can be disposed on the same layer as the first source electrode 215 of each driving circuit D. For example, the data lines DL can be disposed on the upper interlayer insulating layer 140. The data lines DL can include a conductive material. For example, the data lines DL can include a metal, such as aluminum (Al), chromium (Cr), titanium (Ti), molybdenum (Mo), tungsten (W) and copper (Cu), or alloys thereof. The data lines DL can include the same material as the first source electrode 215.

The data lines DL can be disposed on the same layer as the barrier line BL. For example, the date lines DL can be disposed between the upper interlayer insulating layer 140 and the over-coat layer 150. The data lines DL can include the same material as the barrier line BL. For example, the data lines DL can include titanium (Ti). The barrier line BL can be spaced away from the data lines DL. For example, the barrier line BL can be disposed outside three sides of the display area AA except side facing the pad region PAD. Thus, in the display apparatus according to the embodiment of the present invention, inflowing hydrogen to the display area AA through the gate lines GL can be prevented.

The pad region PAD can be electrically connected to the gate driver GIP1 and GIP2. For example, the gate driver GIP1 and GIP2 can receive a clock signal, a reset clock signal, and a start signal through the pad region PAD. The pad region PAD can be electrically connected to the gate driver GIP1 and GIP2 by signal lines SL.

Accordingly, the display apparatus according to the embodiment of the present invention can include the barrier line BL disposed between the encapsulating element 400 and the gate lines GL connecting the gate driver GIP1 and GIP2 to the display area AA, wherein the barrier line BL includes a hydrogen barrier material. Thus, in the display apparatus according to the embodiment of the present invention, inflowing hydrogen to the display area AA through the gate lines GL can be prevented. For example, in the display apparatus according to the embodiment of the present invention, deteriorating the oxide semiconductor pattern of each pixel region PA disposed in the display area AA due to hydrogen diffused from the encapsulating element 400 can be prevented. Therefore, in the display apparatus according to the embodiment of the present invention, the reliability for the driving circuit D of each pixel region PA can be improved.

The display apparatus according to the embodiment of the present invention is described that the display area AA is disposed between two gate driver GIP1 and GIP2. However, the display apparatus according to another embodiment of the present invention can include a single gate driver disposed on one side of the display area AA.

The display apparatus according to the embodiment of the present invention is described that the barrier line BL has a single layer. However, in the display apparatus according to another embodiment of the present invention, the barrier line BL can have a multi-layer structure. For example, in the display apparatus according to another embodiment of the present invention, the barrier line BL can have a structure in which a hydrogen barrier material layer is disposed between conductive layers. The barrier line BL can be formed simultaneously with the data lines DL. Thus, in the display apparatus according to another embodiment of the present invention, the function deterioration of the data lines DL can be prevented, and a process of forming the barrier line BL can be simplified.

In the display apparatus according to another embodiment of the present invention, the first source electrode 215, the first drain electrode 216, the second source electrode 225 and the second drain electrode 226 of each driving circuit D can be formed simultaneously with the barrier line BL. For example, the first source electrode 215, the first drain electrode 216, the second source electrode 225 and the second drain electrode 226 of each driving circuit D can have a stacked structure same as the barrier line BL. Thus, in the display apparatus according to another embodiment of the present invention, the process efficiency can be improved, and the reliability deterioration of the driving circuit D due to hydrogen can be effectively prevented.

The display apparatus according to the embodiment of the present invention is described that the first thin film transistor 210 of each pixel region PA includes an oxide semiconductor pattern.

Figure 3:
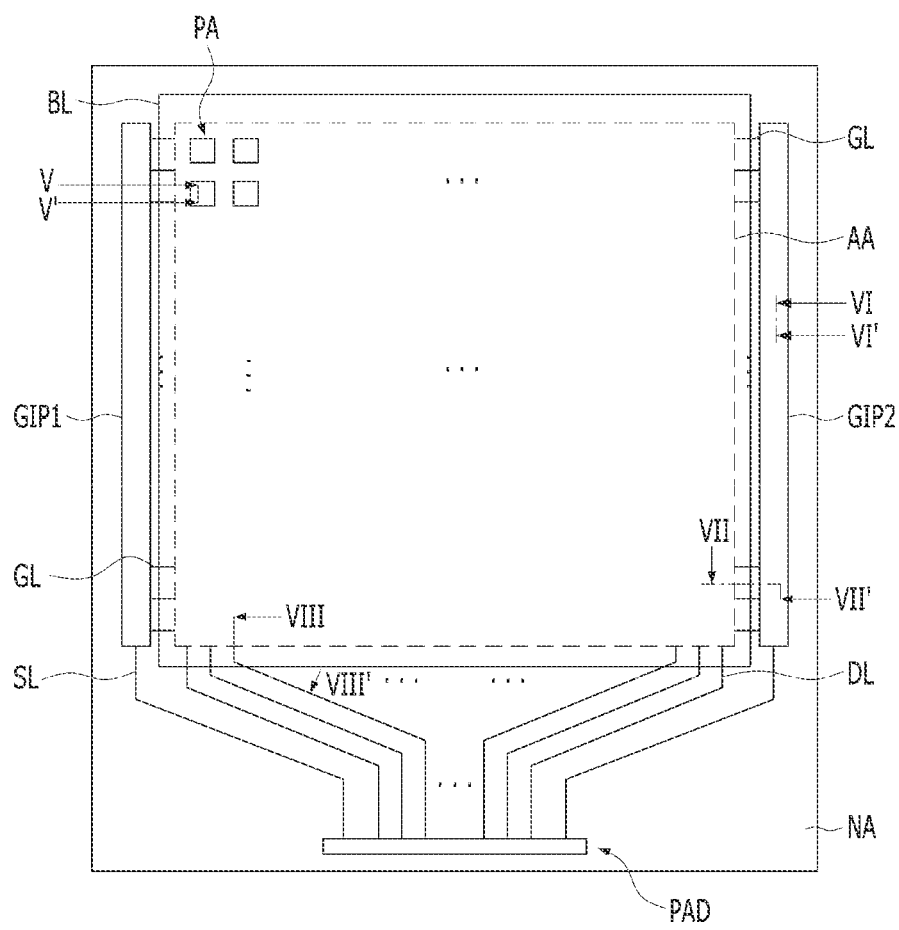
FIG. 3 is a view showing a display apparatus according to another embodiment of the present invention.

However, other examples are possible. FIG. 3 is a view showing the display apparatus according to another embodiment of the present invention, FIG. 4A is a view showing cross-sections taken along line V-V' and line VI-VI' of FIG. 3, and FIG. 4B is a view showing cross-sections taken along line VII-VII' and line VIII-VIII' of FIG. 3.

Figure 4A:
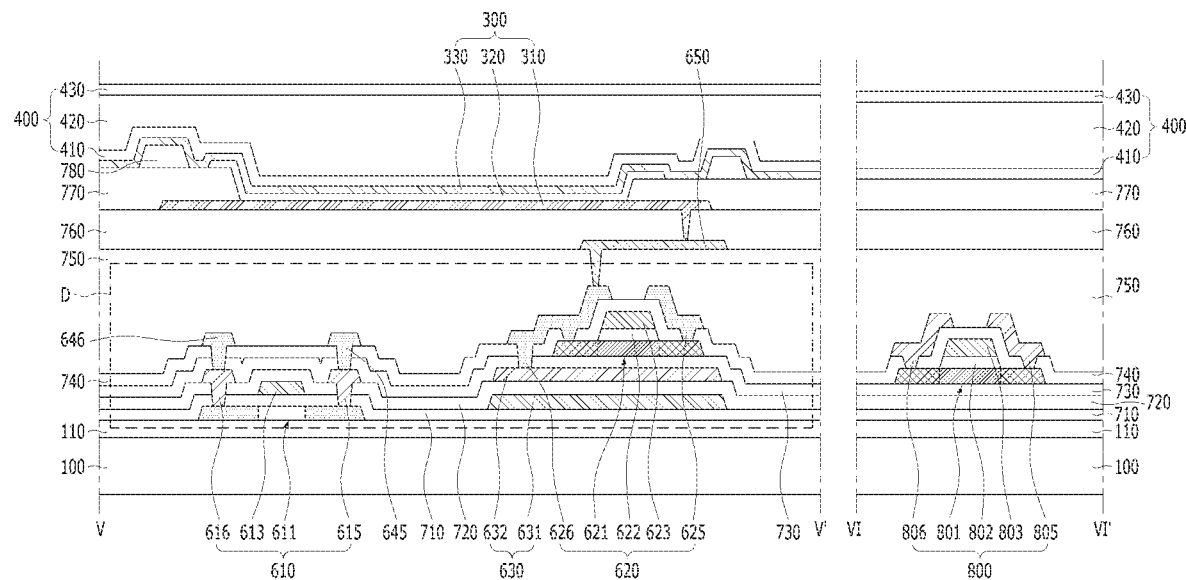
FIG. 4A is a view showing cross-sections taken along line V-V' and line VI-VI' of FIG. 3.
Figure 4B:
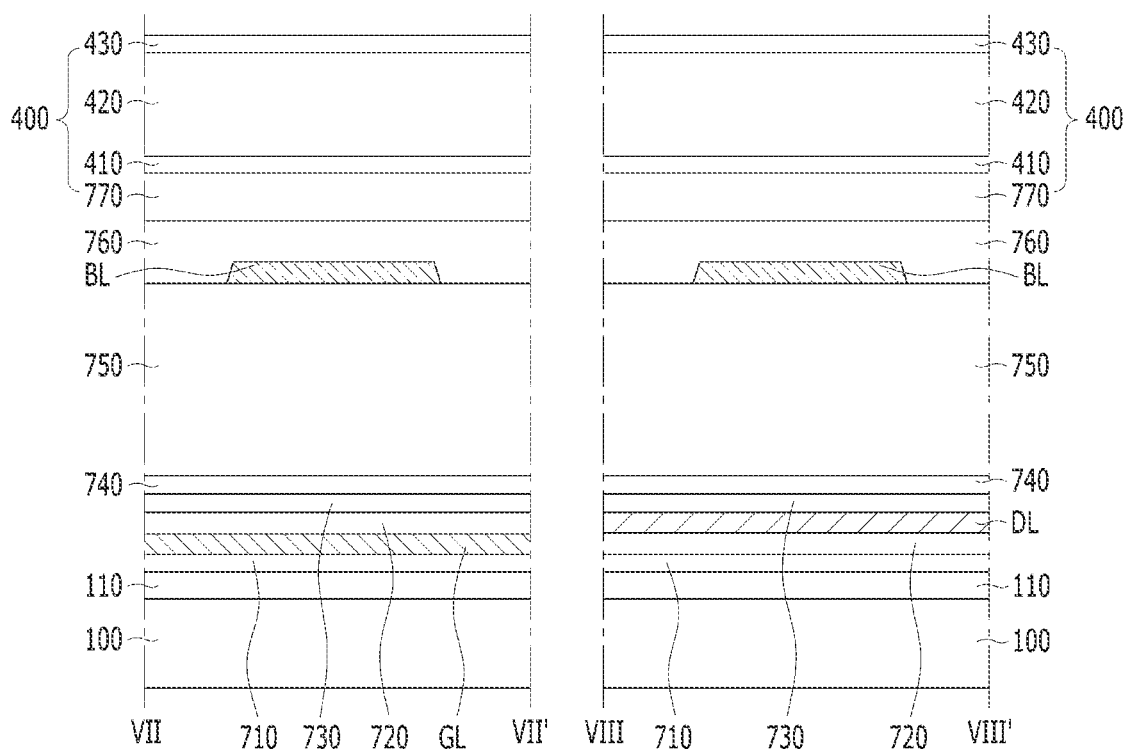
FIG. 4B is a view showing cross-sections taken along line VII-VII' and line VIII-VIII' of FIG. 3.

In the display apparatus according to another embodiment of the present invention, a driving circuit D of each pixel region PA can include a first thin film transistor 610, a second thin film transistor 620 and a storage capacitor 630, and the second thin film transistor 620 of each pixel region PA connected to the corresponding light-emitting device 300 can include a second semiconductor pattern 621 which includes an oxide semiconductor, as shown in FIGS. 3, 4A and 4B.

The first thin film transistor 610 can be disposed between a device substrate 100 and an intermediate insulating layer 730. For example, a first semiconductor pattern 611 of the first thin film transistor 610 can be disposed between a buffer layer 110 and a first gate insulating layer 710, a first gate electrode 613 of the first thin film transistor 610 can be disposed between the first gate insulating layer 710 and a first interlayer insulating layer 720, and a first source electrode 615 and a first drain electrode 616 of the first thin film transistor 610 can be disposed between the first interlayer insulating layer 720 and the intermediate insulating layer 730.

Referring to FIG. 4A, the intermediate insulating layer 730 is illustrated as a single layer, but is not limited thereto. For example, the intermediate insulating layer 730 can have a multi-layer structure in which a layer formed of silicon nitride (SiNx) and a layer formed of silicon oxide (SiOx) are stacked. The intermediate insulating layer 730 can be a double-layer structure of a layer formed of silicon nitride (SiNx) and a layer formed of silicon oxide (SiOx).

The second thin film transistor 620 can be disposed on the storage capacitor 630. For example, the storage capacitor 630 can be disposed between the buffer layer 110 and the intermediate insulating layer 730. A first capacitor electrode 631 and a second capacitor electrode 632 of the storage capacitor 630 can include a metal. For example, the first capacitor electrode 631 can include the same material as the first gate electrode 613. The first capacitor electrode 631 can be disposed between the first gate insulating layer 710 and the first interlayer insulating layer 720. For example, the second capacitor electrode 632 can include the same material as the first source electrode 615 and the first drain electrode 616. The second capacitor electrode 632 can be disposed between the first interlayer insulating layer 720 and the intermediate insulating layer 730.

A second drain electrode 626 of the second thin film transistor 620 can be connected to the storage capacitor 630. For example, the intermediate insulating layer 730 can include a capacitor contact hole partially exposing the second capacitor electrode 632. The second drain electrode 626 can be in direct contact with the second capacitor electrode 632 in the capacitor contact hole.

A second interlayer insulating layer 740 can be disposed on a second gate electrode 623 of the second thin film transistor 620. An intermediate source electrode 645 and an intermediate drain electrode 646 can be disposed on the second interlayer insulating layer 740. The intermediate source electrode 645 can be connected to the first source electrode 615. The intermediate drain electrode 646 can be connected to the first drain electrode 616. The intermediate source electrode 645 and the intermediate drain electrode 646 can be disposed on the same layer as the second drain electrode 626. For example, the intermediate source electrode 645 and the intermediate drain electrode 646 can be formed simultaneously with the second source electrode 625 and the second drain electrode 626 of the second thin film transistor 620. Thus, in the display apparatus according to another embodiment of the present invention, the characteristics deterioration of the driving circuit D due to the introduction of hydrogen can be prevented regardless of the configuration of the driving circuit D of each pixel area PA.

Referring to FIG. 4A, the second interlayer insulating layer 740 is illustrated as a single layer, but is not limited thereto. For example, the second interlayer insulating layer 740 can have a multi-layer structure in which a layer formed of silicon nitride (SiNx) and a layer formed of silicon oxide (SiOx) are stacked. The second interlayer insulating layer 740 can be a double-layer structure of a layer formed of silicon nitride (SiNx) and a layer formed of silicon oxide (SiOx).

In the display apparatus according to another embodiment of the present invention, the gate driver GIP1 and GIP2 can include an oxide semiconductor pattern. For example, in the display apparatus according to another embodiment of the present invention, a driver thin film transistor 800 of the gate driver GIP1 and GIP2 can be disposed on the intermediate insulating layer 730. The driver thin film transistor 800 can have the same configuration as the second thin film transistor 620. For example, a third semiconductor pattern 801 of the driver thin film transistor 800 can include the same material as the second semiconductor pattern 621. Thus, in the display apparatus according to another embodiment of the present invention, the characteristics deterioration of the gate driver GIP1 and GIP2 can be prevented by to the barrier line BL. Therefore, in the display apparatus according to another embodiment of the present invention, the degree of freedom for the configuration of the gate driver GIP1 and GIP2 can be improved.

In the display apparatus according to another embodiment of the present invention, the barrier line BL can intersect the data lines DL. The barrier line BL can be disposed on a layer different from the data lines DL. For example, in the display apparatus according to another embodiment of the present invention, a first over-coat layer 750 and a second over-coat layer 760 can be sequentially stacked on the driving circuit D, a connection electrode 650 can be disposed between the first over-coat layer 750 and the second over-coat layer 760, the first electrode 310 of the light-emitting device 300 can be connected to the second drain electrode 626 via the connection electrode 650, and the barrier line BL can be disposed on the same layer as the connection electrode 650. The connection electrode 650 can include a hydrogen barrier material. For example, the connection electrode 650 can have a multi-layer structure including a conductive layer formed of titanium (Ti). The data lines DL can include a material different from the barrier line BL. Thus, in the display apparatus according to another embodiment of the present invention, the degree of freedom for the material of the gate lines GL and the data lines DL can be improved.

The first over-coat layer 750 and the second over-coat layer 760 can include an organic material. For example, the first over-coat layer 750 and the second over-coat layer 760 can include at least one of acryl resin, epoxy resin, phenolic resin, polyamide resin and polyimide resin.

Referring to FIG. 4A, it is illustrated that the connection electrode 650 is connected to the second thin film transistor 620, but is not limited thereto. For example, the connection electrode 650 can be connected to the first thin film transistor 610. The connection electrode 650 can be connected to the first drain electrode 616 or the first source electrode 615 of the first thin film transistor 610 in a connecting contact hole formed in the first over-coat layer 750. Thus, the connection electrode 650 can connect the first electrode 310 of the light-emitting device 300 to the first thin film transistor 610.

The display apparatus according to the embodiment of the present invention is described that the barrier line BL is insulated from the display area AA, the gate driver GIP1 and GIP2, and the pad region PAD.

Figure 5:
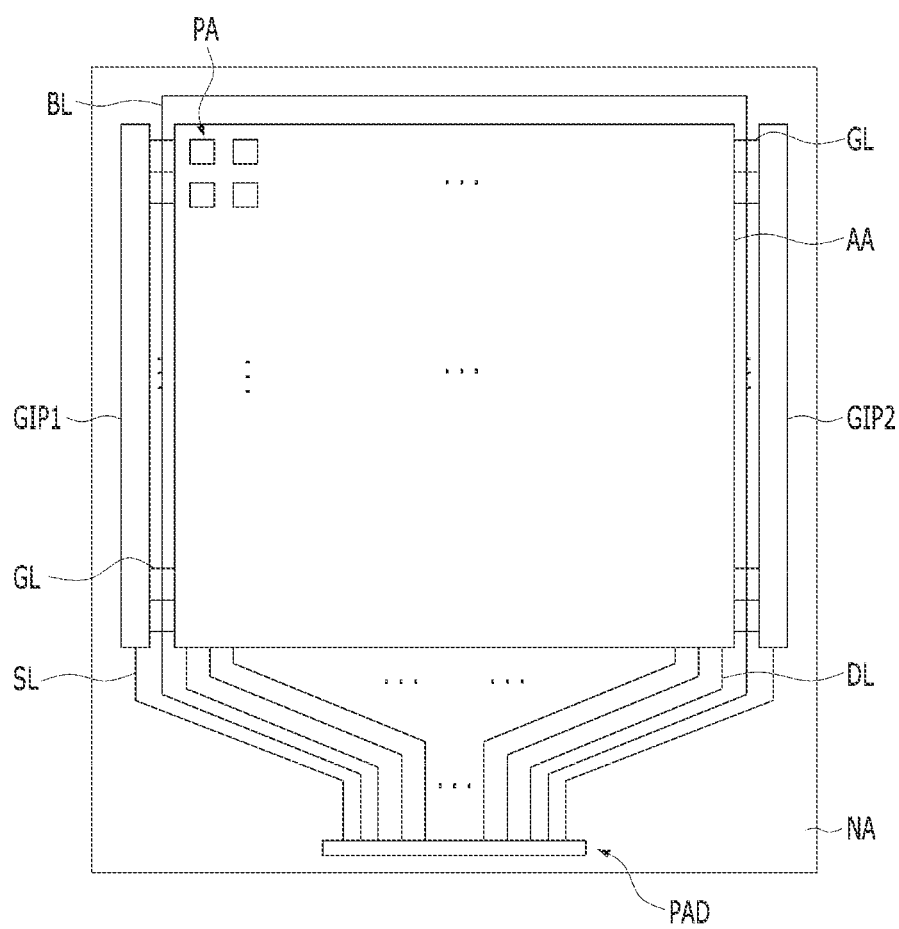
FIGS. 5 to 7 are views respectively showing a display apparatus according to another embodiment of the present invention.
Figure 6:
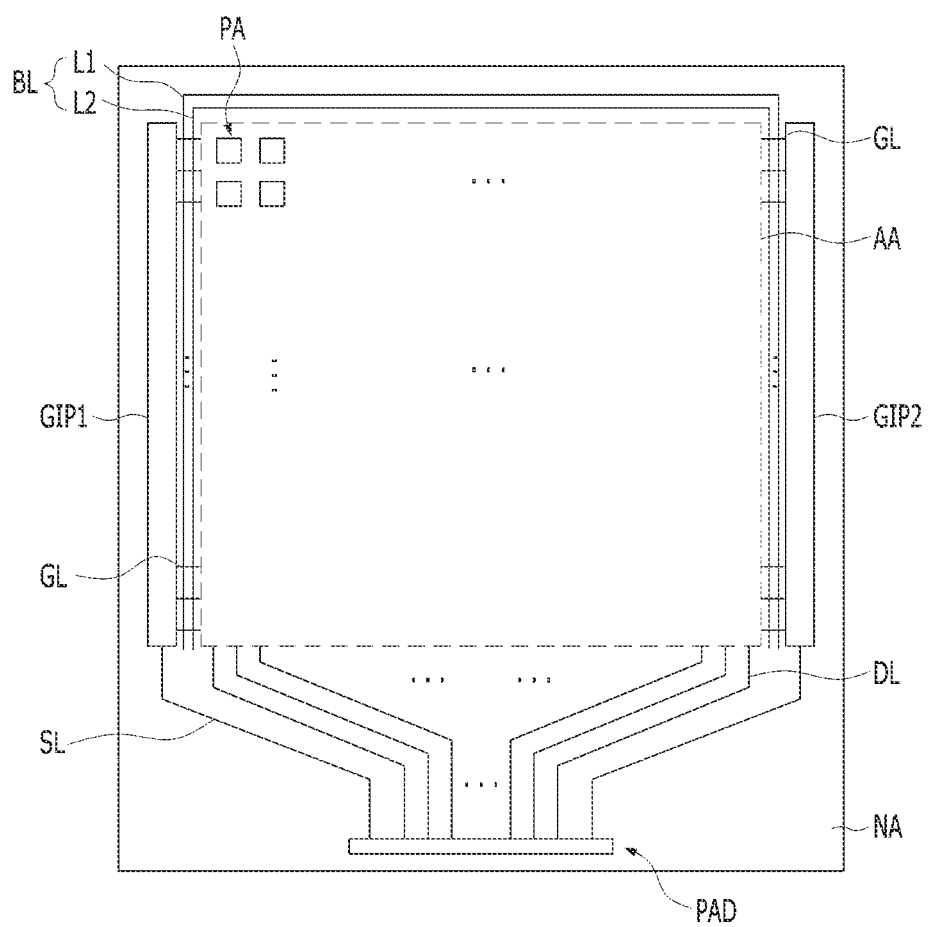
Figure 7:
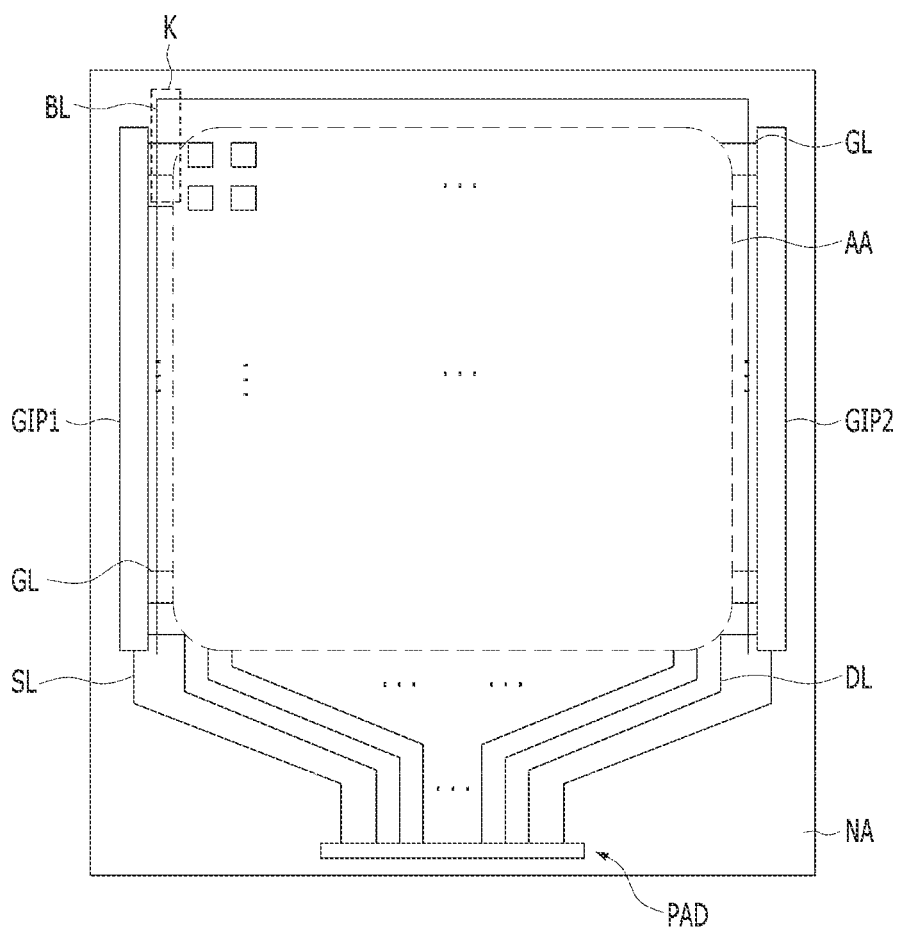
Figure 8:
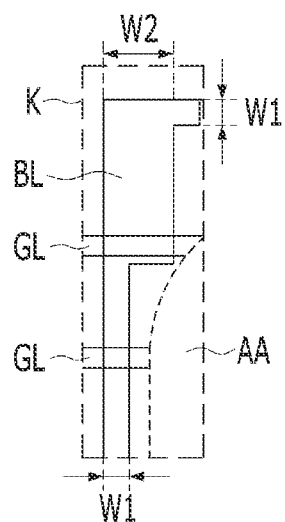
FIGS. 8 and 9 are enlarged views of K region in FIG. 7.
Figure 9:
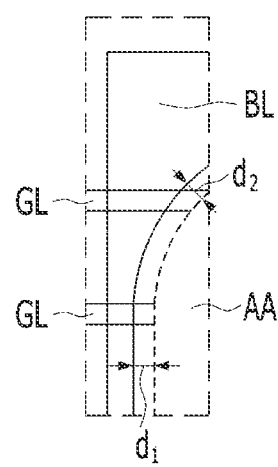

However, other examples are possible. FIGS. 5 to 7 are views respectively showing the display apparatus according to another embodiment of the present invention. FIGS. 8 and 9 are enlarged views of K region in FIG. 7.

In the display apparatus according to another embodiment of the present invention, a specific voltage can be applied to the barrier line BL. For example, in the display apparatus according to another embodiment of the present invention, the barrier line BL can be connected to the pad region PAD, as shown in FIG. 5. Thus, in the display apparatus according to another embodiment of the present invention, one of the positive power voltage VDD, the negative power voltage VSS, and the gate signal voltage Vgl can be applied to the barrier line BL. Thus, in the display apparatus according to another embodiment of the present invention, the blocking and the capturing of hydrogen by the barrier line BL can be effectively performed.

The display apparatus according to the embodiment of the present invention is described that the barrier line BL is a single line. However, in the display apparatus according to another embodiment of the present invention, the barrier lines BL can be composed of multiple lines. For example, in the display apparatus according to another embodiment of the present invention, the barrier line BL can include a first conductive line L1 and a second conductive line L2 disposed side by side with the first conductive line L1, as shown in FIG. 6. The first conductive line L1 can be disposed between the second conductive line L2 and the gate driver GIP1 and GIP2. For example, the second conductive line L2 can extend parallel with the first conductive line L1. Thus, in the display apparatus according to another embodiment of the present invention, the blocking of hydrogen by the barrier line BL can be effectively performed.

The display apparatus according to the embodiment of the present invention is described that the display area AA has a rectangular shape. However, in the display apparatus according to another embodiment of the present invention, a distance between the display area AA and the gate driver GIP1 and GIP2 can be changed depending on the location.

For example, in the display apparatus according to another embodiment of the present invention, a corner of the display area AA can have a round shape, as shown in FIGS. 7 and 8. Around the corner of the display area AA, a length of each gate line GL exposed to the encapsulation element 400 can be increased. The barrier line BL can have a relatively larger width near the corner of the display area AA. For example, the barrier line BL can include a first region having a first width W1 and a second region having a second width W2 larger than the first width W1, and the second region of the barrier line BL can be disposed on a region corresponding to the corner of the display area AA. For example, in the display apparatus according to another embodiment of the present invention, the width of the barrier line BL can be changed according to a relatively length of the gate lines GL exposed to the encapsulating element 400. Thus, in the display apparatus according to another embodiment of the present invention, the blocking of hydrogen by the barrier line BL can be effectively performed. Therefore, in the display apparatus according to another embodiment of the present invention, the reliability of the driving circuit D of each pixel region can be improved regardless of the shape of the display area AA.

In the display apparatus according to another embodiment of the present invention, a distance between the display area AA and the barrier line BL can be constant. For example, in the display apparatus according to another embodiment of the present invention, the display area AA can have a rounded corner, and a side of the barrier line BL toward the display area AA can have a shape corresponding to the rounded corner of the display area AA, as shown in FIG. 9. For example, in the display apparatus according to another embodiment of the present invention, a first distance d1 between the barrier line BL and the display area AA at a side of the display area AA can be the same as a second distance d2 between the barrier line BL and the display area AA at a corner of the display area AA. Thus, in the display apparatus according to another embodiment of the present invention, the deviation of hydrogen blocking by the barrier line BL can be prevented or minimized.

Therefore, in the display apparatus according to another embodiment of the present invention, the characteristics deviation of the thin film transistors due to the introduction of hydrogen can be prevented or minimized.

As a result, the display apparatus according to one or more embodiments of the present invention can include the barrier line between the gate lines and the encapsulating element, wherein the barrier line includes a hydrogen barrier material. Thus, in the display apparatus according to one or more embodiments of the present invention, the gate lines may not serve as a moving path of hydrogen.

Further, in the display apparatus according to the embodiments of the present invention, the reliability of the thin film transistors including an oxide semiconductor pattern and the driving circuit having the same can be improved.

What is claimed is:

1. A display apparatus comprising:
pixel regions, each of the pixel regions including a driving circuit and a light-emitting device connected to the driving circuit, the driving circuit including an oxide semiconductor pattern;
a gate driver disposed outside the pixel regions and connected to each pixel region by gate lines;
an encapsulating element overlapping with the gate lines; and
a first barrier line between the gate lines and the encapsulating element, the first barrier line intersecting the gate lines,
wherein the first barrier line includes a hydrogen barrier material.

2. The display apparatus according to claim 1, wherein the hydrogen barrier material includes titanium (Ti).

3. The display apparatus according to claim 1, wherein the first barrier line is disposed between the pixel regions and the gate driver.

4. The display apparatus according to claim 1, wherein in each pixel region, the light-emitting device is disposed between the oxide semiconductor pattern and the encapsulating element.

5. The display apparatus according to claim 1, further comprising a pad region disposed outside the pixel regions,
wherein the pad region is connected to each pixel region by data lines, and
wherein the data lines include a same material as the first barrier line.

6. The display apparatus according to claim 5, wherein the first barrier line is spaced away from the data lines.

7. The display apparatus according to claim 1, further comprising a second barrier line disposed between the first barrier line and the gate driver.

8. The display apparatus according to claim 7, wherein the second barrier line extends side by side with the first barrier line.

9. The display apparatus according to claim 1, further comprising a pad region disposed outside the pixel regions,
wherein the pad region is connected to each pixel region by data lines, and
wherein the first barrier line is connected to the pad region.

10. The display apparatus according to claim 1, wherein the driving circuit includes a gate electrode overlapping with a channel region of the oxide semiconductor pattern, and
wherein the gate electrode is connected to one of the gate lines.

11. The display apparatus according to claim 10, wherein the driving circuit further includes:
a gate insulating layer disposed between the oxide semiconductor pattern and the gate electrode,
a source electrode connected to a source region of the oxide semiconductor pattern, and
a drain electrode connected to a drain region of the oxide semiconductor pattern, and
wherein the source electrode and the drain electrode are disposed on a same layer as the first barrier layer.

12. A display apparatus comprising:
a device substrate including a display area and a non-display area disposed outside the display area;

a gate driver disposed on the non-display area of the device substrate, and connected to the display area by gate lines;

a barrier line intersecting the gate lines, and including a hydrogen barrier material; and an encapsulating element covering the gate lines, wherein the barrier line is disposed between the gate lines and the encapsulating element.

13. The display apparatus according to claim 12, further comprising driving circuits on the display area of the device substrate, wherein each of the driving circuits includes a thin film transistor connected to one of the gate lines, and wherein the thin film transistor includes an oxide semiconductor pattern.

14. The display apparatus according to claim 12, further comprising a pad region disposed on the non-display area of the device substrate and connected to the display area by data lines, wherein a stacked structure of each of the data lines includes at least one layer formed as a same material as the barrier line.

15. The display apparatus according to claim 14, wherein the stacked structure of each of the data lines is different from a stacked structure of the barrier line.

16. The display apparatus according to claim 12, wherein the barrier line is disposed between the display area and the gate driver along an edge of the display area.

17. The display apparatus according to claim 16, wherein the barrier line has a closed loop shape extending along the edge of the display area.

18. The display apparatus according to claim 12, wherein the barrier line includes:

a first region having a first width, and a second region having a second width larger than the first width of the first region, wherein a corner of the display area has a round shape, and wherein the second region of the barrier line corresponds to the corner of the display area.

19. The display apparatus according to claim 18, wherein a distance between the barrier line and the display area is constant.

20. The display apparatus according to claim 12, wherein hydrogen diffused from the encapsulating element toward the gate lines is absorbed and/or blocked by the barrier line.

* * * * *